United States Patent [19]

Robb

[11] Patent Number: 4,970,173

[45] Date of Patent: Nov. 13, 1990

[54] METHOD OF MAKING HIGH VOLTAGE VERTICAL FIELD EFFECT TRANSISTOR WITH IMPROVED SAFE OPERATING AREA

[75] Inventor: Stephen P. Robb, Tempe, Ariz.

[73] Assignee: Motorola, Inc., Schaumburg, Ill.

[21] Appl. No.: 489,853

[22] Filed: Mar. 2, 1990

Related U.S. Application Data

[62] Division of Ser. No. 374,811, Jul. 3, 1989, abandoned.

[51] Int. Cl.$^5$ .......................................... H01L 21/265
[52] U.S. Cl. ......................................... 437/29; 437/40; 437/41; 437/235; 437/247; 357/23.4
[58] Field of Search ............... 357/23.4, 23.8; 437/29, 437/40, 41, 43, 228, 235, 247

[56] References Cited

U.S. PATENT DOCUMENTS

| | | | |
|---|---|---|---|
| 4,587,713 | 5/1986 | Goodman et al. | 357/23.4 |
| 4,620,211 | 10/1986 | Baliga et al. | 357/23.4 |
| 4,680,604 | 7/1987 | Nakagawa et al. | 357/23.4 |
| 4,684,413 | 8/1987 | Goodman et al. | 357/23.4 |
| 4,705,759 | 11/1987 | Lidow | 357/23.4 |
| 4,748,103 | 5/1988 | Hollinger | 437/41 |
| 4,774,198 | 2/1988 | Contiero et al. | 437/29 |
| 4,803,532 | 2/1989 | Mihara | 357/23.4 |
| 4,855,799 | 8/1989 | Tanabe et al. | 357/23.4a |
| 4,868,138 | 9/1989 | Cham et al. | 437/41 |
| 4,902,636 | 2/1990 | Akiyama | 437/29 |
| 5,779,123 | 10/1988 | Bencuya et al. | 357/23.4 |

FOREIGN PATENT DOCUMENTS

| | | | |
|---|---|---|---|
| 0231860 | 12/1984 | Japan | 357/23.4 |
| 0156882 | 7/1986 | Japan | 437/29 |
| 0060236 | 3/1987 | Japan | 437/29 |
| 0177473 | 7/1988 | Japan | 357/23.4 |

OTHER PUBLICATIONS

Mutsushio et al.; "An Isolated Gate Bipolar Transistor with aligned DMOS Structure", IEDM 88-813, 1988.
Matsuhio Mori et al., "An Isolated Gate Bipolar Transistor with Self-Aligned DMOS Structure IEDM", 1988, pp. 813-816.

Primary Examiner—Brian E. Hearn
Assistant Examiner—T. Thomas
Attorney, Agent, or Firm—Joe E. Barbee; Stuart T. Langley

[57] ABSTRACT

A vertical field effect transistor having a first low resistivity region which determines breakdown voltage and a second low resistively region which is formed underneath a portion of a source is provided. The second low resistivity region lowers the gain of a parasitic bipolar transistor, and lowers resistance of a base region under the source of the field effect transistor, improving the commutating safe operating area of the vertical field effect transistor.

4 Claims, 2 Drawing Sheets

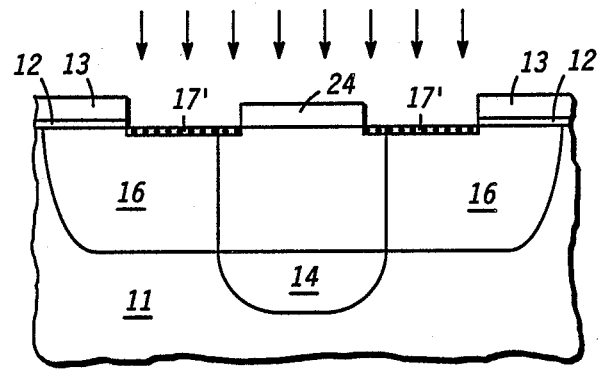
FIG. 3
FIG. 4
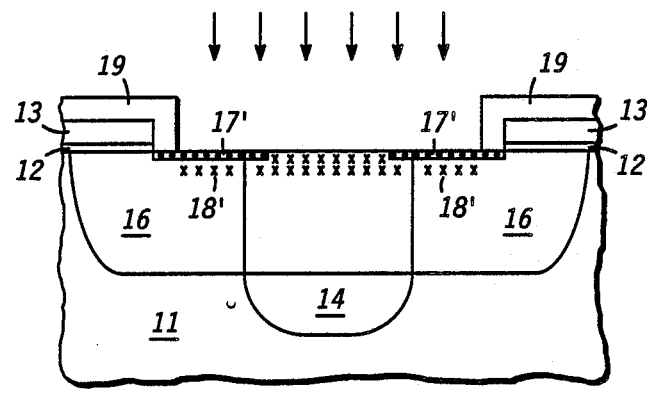

METHOD OF MAKING HIGH VOLTAGE VERTICAL FIELD EFFECT TRANSISTOR WITH IMPROVED SAFE OPERATING AREA

This is a division of Ser. No. 374,811, filed July 3, 1989, now abandoned.

BACKGROUND OF THE INVENTION

The present invention relates, in general, to vertical field effect transistors. More particularly, the invention relates to vertical field effect transistors with improved commutating safe operating area.

Vertical field effect transistors, also called double diffused metal oxide semiconductor (DMOS) field effect transistors, are well known. DMOS transistors comprise a polysilicon layer formed on a semiconductor substrate and selectively etched to form a polysilicon gate thereby exposing a portion of the substrate. The polysilicon gate is separated from the substrate by a gate oxide layer. For an N-channel device, a P-type base and an N-type source are diffused into the exposed portion of the substrate using the polysilicon gate as a mask, so that a portion of both the source and the base extend beneath the polysilicon gate. A channel region is thus formed beneath the gate between the lateral boundaries of the source and the base. The semiconductor substrate serves as a drain for the DMOS transistor, and is N-type in the case of an N-channel transistor. A gate electrode is formed in contact with the polysilicon gate, and a drain electrode is formed in contact with the substrate. A source electrode is formed in contact with both the source and the base of the transistor.

In normal operation, the channel region is activated by applying charge to the polysilicon gate, which causes an equal and opposite charge to form in the channel region. For the N-channel transistor described hereinbefore, positive charge on the polysilicon gate causes a negative charge layer to form in the channel between the substrate and the source so that current can flow from the drain, through the channel, to the source. When negative charge, or no charge, is applied to the polysilicon gate, current flow through the channel is normally blocked by a PN diode formed between the base and the substrate.

A parasitic bipolar transistor is formed by the source, which acts as an emitter, the base which acts as a base, and the substrate which acts as a collector. The source electrode shorts the base and the emitter of the parasitic transistor, as described hereinbefore. As long as current flow in the base is confined to the channel region, the source electrode effectively prevents turn on of the parasitic transistor. In some applications, however, the PN diode formed by the base and the substrate is forward biased, allowing current to flow from the source electrode, through the base region, to the substrate. In particular, some applications cause the diode to be cycled between a forward bias condition and a reverse bias condition, in which case charge moves from the source electrode to the periphery of the base when the device is switched from forward bias to reverse bias, causing current flow in the base underneath the source. This current flow is necessary to establish a depletion region in the PN diode before the diode can support reverse bias, and is commonly called reverse recovery current. Applications which result in a reverse recovery current are called commutating mode applications. If resistance of the base region under the source is high, the parasitic bipolar transistor will turn on when the reverse recovery current flows, resulting in catastrophic failure of the transistor. Power limitations of the DMOS transistor operating in the commutating mode is hereinafter referred to as commutating safe operating area (CSOA) of the DMOS transistor.

Another problem caused by the parasitic bipolar transistor occurs in applications where the DMOS transistor is required to conduct a large reverse current after the drain-source diode is avalanched. These applications are called unclamped inductive switching (UIS) applications because current is usually caused by avalanching the PN diode while switching an inductive load. Like a CSOA applications, UIS applications result in current flow under the source which can turn on the parasitic bipolar transistor, causing catastrophic failure of the device.

In the past, the problem of the resistance of the base underneath the source was addressed by forming a low resistivity region of the same conductivity type as the base before forming the source so that the low resistivity region was adjacent to the source. The low resistivity region extended vertically beyond the base, so that the reverse recovery current flowed primarily in the low resistivity region instead of the base, due to the lower resistance of the low resistivity region. For the N-channel transistor this low resistivity region is P-type. The source was subsequently formed around the low resistivity region in a ring shape so that a portion of the low resistivity region was exposed in the middle of the source. A source electrode was then formed in contact with the exposed portion of the low resistivity region and the source. This method resulted in a relatively small low resistivity region adjacent to the source due to the limitations of photolithographic processing, and offered limited CSOA improvement. Even when the low resistivity region was doped more heavily, further lowering the resistivity, current flow under the source would turn on the parasitic transistor. Since the junction between the low resistivity region and the substrate determined the breakdown voltage of the transistor, lowering the resistivity to improve CSOA had a negative side effect of reducing breakdown voltage.

More recently, a method was disclosed wherein the low resistivity region was formed using a phosphosilicate glass (PSG) sidewall spacer formed on an edge of the polysilicon gate. In this method, the low resistivity region was formed using the PSG sidewall spacer as a mask, and the phosphorous in the PSG diffused into the silicon during thermal processing to form the source. Using this method, the low resistivity region was self aligned to the polysilicon gate so that only a small portion of the source extended beyond the low resistivity region. A device of this type was described by Mutsushio Mori et al in "An Isolated Gate Bipolar Transistor with a Self Aligned DMOS Structure", IEDM 88-813, 1988. This method, though offering somewhat improved CSOA performance, has limited application because the PSG sidewall spacer could not be removed without damaging the gate region, and it was undesirable to leave the PSG sidewall spacer in the device as it resulted in corrosion of the source electrode which was in contact with the oxide sidewall spacer.

Another method has been used in which the source region and the base region are etched so that a portion of each region is exposed at the surface, and a source electrode is formed in contact with the exposed portions. Such a method is shown in U.S. Pat. No. 4,748,103 issued to Theodore Hollinger on May 31, 1988. This method improves CSOA performance by providing a large area metal contact which extends into the base region deeper than, but still adjacent to, the source. The silicon etching process used to contact the base and source regions can create surface damage, which degraded device leakages. Although this structure provided a smaller area under the source which was exposed to reverse recovery current, it did not seem to solve the problem of bipolar turn on when current did flow under the source.

Another device, described in U.S. Pat. No. 4,587,713 issued to Goodman et al., comprises a low resistivity region which is formed at the same time as the source, using the same mask. In this device, the low resistivity region necessarily underlies all of the source, and extends laterally beyond the source so that a portion of the low resistivity region is provided under the channel. While this device directly addresses the issued of high base resistance under the source, it relies on a deep boron implant having a very narrow distribution to ensure that the low resistivity region does not diffuse into the channel. When the low resistivity region extends into or very near the channel, threshold voltage of the field effect transistor increases, and becomes very difficult to control. Thus, this boron implant and subsequent diffusion make the device difficult to manufacture.

Accordingly, it is an object of the present invention to provide an improved method for making a vertical field effect transistor.

Another object of the present invention is to provide a vertical field effect transistor with improved unclamped inductive switching performance.

It is a further object of the present invention to provide a vertical field effect transistor with improved commutating safe operating area (CSOA).

It is a further object of the present invention to provide a vertical field effect transistor having a low resistivity region underneath a source.

It is a further object of the present invention to provide a method for making a vertical field effect transistor having both high breakdown voltage and improved CSOA performance.

It is still a further object of the present invention to provide a method for making a vertical field effect transistor which does not require silicon etching.

It is another object of the present invention to provide a vertical field effect transistor having improved CSOA performance which does not require additional mask steps.

It is a further object of the present invention to provide a vertical field effect transistor which can be mass produced with little variability in performance.

It is another object of the present invention to provide a method for manufacturing a vertical field effect transistor having improved CSOA performance and a high degree of threshold voltage control.

SUMMARY OF THE INVENTION

The above and other objects and advantages of the present invention are achieved by providing a vertical field effect transistor having a first low resistivity region which determines breakdown voltage and a second low resistivity region which is formed underneath a portion of a source. The second low resistivity region lowers the gain of a parasitic bipolar transistor, and lowers resistance of a base region under the source of the field effect transistor, improving the commutating safe operating area of the vertical field effect transistor. A method for making the vertical field effect transistor is also disclosed.

BRIEF DESCRIPTION OF THE DRAWINGS

FIGS. 2-4 illustrate enlarged cross sectional views of a portion of the DMOS transistor shown in FIG. 1 at various stages of fabrication.

DETAILED DESCRIPTION OF THE DRAWINGS

Figure 1:
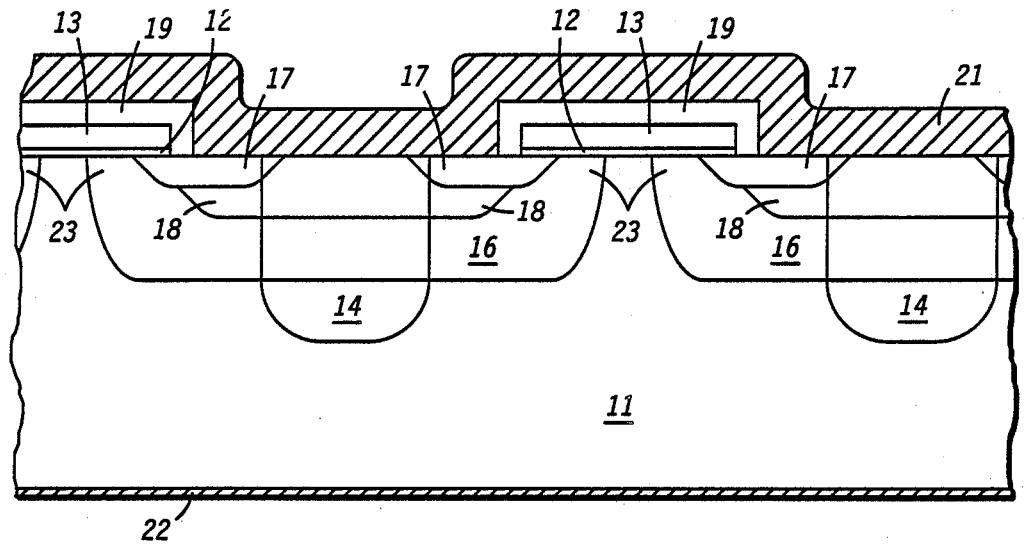
FIG. 1 illustrates an enlarged cross sectional view of a DMOS field effect transistor formed using the method of the present invention.

FIG. 1 illustrates a cross sectional view of a DMOS field effect transistor formed using the method of the present invention processed through metallization. DMOS field effect transistors usually comprise a plurality of similar cells such as shown in FIG. 1, all the cells coupled in parallel. In a preferred embodiment, the DMOS field effect transistor is an N-channel transistor, though it should be understood that a P-channel transistor could be manufactured with a similar process. Gate oxide 12 is thermally grown on N-type silicon substrate 11. Although substrate 11 is illustrated as being a single layer, those skilled in the art will understand that substrate 11 may have one or more epitaxial layers on its upper surface to accommodate source and channel areas. Accordingly, the word "substrate" as used herein is intended to cover all such configurations. Polysilicon gate 13 is formed by chemical vapor deposition or a similar process, of a polysilicon layer covering gate oxide 12. The polysilicon layer is selectively etched to form polysilicon gate 13. P-type base 16 and N-type source 17 are diffused through a window formed by polysilicon gate 13 using polysilicon gate 13 as a mask. Thus channel region 23 is formed beneath gate 13 between the lateral boundaries of P-type base 16 and N-type source 17, separated from polysilicon gate 13 by gate oxide 12. First low resistivity region 14 is formed between adjacent source regions 17 and is deeper than P-type base 16 so that a PN junction is formed between low resistivity region 14 and substrate 11. Because low resistivity region 14 is doped more heavily than P-type base 16, breakdown voltage of the vertical field effect transistor is determined by the junction formed between low resistivity region 14 and substrate 11. Second low resistivity region 17 is formed underneath a portion of adjacent source region 17 and is shallower than P-type base 16 so that the resistivity of low resistivity region 18 does not affect breakdown voltage of the vertical field effect transistor. Source electrode 21 is formed by sputtering, evaporation, or the like in contact with low resistivity region 18 and source region 17. Drain electrode 22 is formed in contact with substrate 11 and is usually formed on the back side of substrate 11. A gate electrode (not shown) is formed in contact with gate 13. In operation, the gate electrode is energized and a positive charge is applied to polysilicon gate 13 causing a negative charge layer to develop in channel region 23. The negative charge layer couples source 17 and substrate 11 so that current flows from source electrode 21 through source region 17 through channel 23 through substrate 11 to drain electrode 22.

Figure 2:
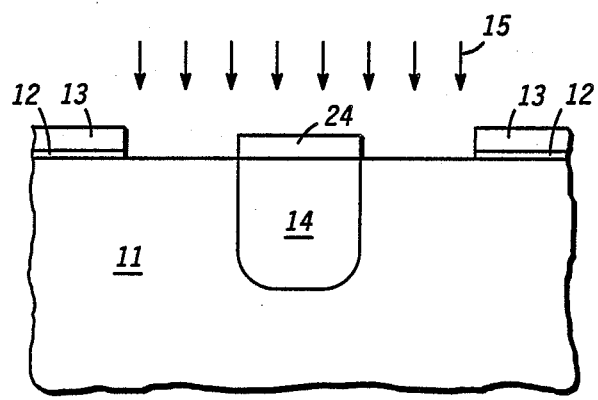

FIG. 2 illustrates an enlarged cross sectional view of the DMOS transistor shown in FIG. 1 processed through base implantation. Low resistivity region 14 is formed in semiconductor substrate 11 by conventional photoresist and diffusion processes. Protect oxide 24 is formed on top of low resistivity region 14 during the diffusion process and subsequently patterned so that it covers at least a portion of low resistivity region 14. Protect oxide 24 may or may not cover all of low resistivity region 14, it is only important that a portion of low resistivity region 14 is protected so that electrical contact can be made to low resistivity region 14 as shown in FIG. 1. A gate oxide layer is formed on substrate 11 and a polysilicon layer formed on top of the gate oxide layer. The polysilicon layer and gate oxide layer are patterned to form polysilicon gate 13 and gate oxide 12. Polysilicon gate 13 and gate oxide 12 are used as a mask for a base implant used to form base region 16 shown in FIG. 1. For an N-channel device, P-type dopant is usually implanted into substrate 11, illustrated by arrows 15 in FIG. 2.

FIG. 3 illustrates the vertical field effect transistor portion after thermal redistribution of the base implant. Thermal redistribution causes base region 16 to form, and low resistivity region 14 to expand both laterally and vertically. A portion of base 16 extends beneath polysilicon gate 13. Source dopant ions 17', illustrated by dots near the surface of base 16, are implanted into base 16 and a portion of low resistivity region 14 which extends beyond protect oxide 24. The source implant is masked by gate 13 and gate oxide 12 as well as protect oxide 24. Preferably, source dopant 17' is arsenic or a similar slow diffusing dopant. At this point, source dopant 17' may be annealed, but is not redistributed, and so forms a thin implanted region near the surface of base 16 and low resistivity region 14.

FIG. 4 illustrates the vertical field effect transistor portion further along in processing. A dielectric layer is formed covering polysilicon gate 13, an edge of gate oxide 12, implanted region 17' and protect oxide 24. The dielectric layer is selectively etched, along with all of protect oxide 24, to expose low resistivity region 14 and a portion of the region implanted with source dopant 17'. A conventional pre-ohmic pattern may be used for the selective etch of dielectric layer 19, so that no additional mask steps are necessary to produce the structure of the present invention. Another portion of the implanted region adjacent to polysilicon gate 13 is protected by dielectric layer 19. Dopant ions 18' of the same conductivity type as base 16 and low resistivity region 14 are implanted after the formation of dielectric layer 19, and are illustrated by X's near the surface of base 16 and low resistivity region 14. Dopant 18' must be a dopant which diffuses faster than dopant 17'; when arsenic is used for 17', boron is an acceptable dopant for 18'. Dielectric layer 19 serves to mask a portion of implanted region 17' for reasons described hereinafter. Dopant 18 is preferably implanted deeper than the dopant 17'.

Referring again to FIG. 1 the field effect transistor of FIG. 4 is heated so as to thermally redistribute dopant 17' and 18'. Dopant 17' diffuses laterally underneath gate 13 and gate oxide 12 to form a source 17. Dopant 18 diffuses vertically underneath source 17 to form second low resistivity region 18. Because dopant 18 diffuses faster than dopant 17, low resistivity region 18 will be deeper than source 17 even if the difference in implant depth is minimal. Because dielectric 19 masked a portion of the region implanted with dopant 17' shown in FIG. 4, low resistivity region 18 will not extend beyond source 17 into channel region 23 after thermal redistribution. Because dopant 17' and 18' are implanted using different masks, the thermal redistribution step has a great deal of flexibility and robustness in that a large variation in diffusion time or temperature will not cause low resistivity region 18 to extend into channel 23. Thus, threshold voltage of the field effect transistor will not be affected by low resistivity region 18. Source metal 21 can now be formed covering dielectric 19 and contacting source 17 and low resistivity regions 14 and 18.

Low resistivity region 18, together with base 16 act as a base for a parasitic bipolar transistor having source 17 as an emitter and substrate 11 as a collector. Low resistivity region 18 reduces the gain of the parasitic bipolar transistor, and reduces series base resistance of the parasitic bipolar transistor. Thus low resistivity region 18 reduces the tendency of the parasitic bipolar transistor to turn on when current flows underneath source 17. In a commutating mode or unclamped inductive switching application, a reverse recovery current will flow through low resistivity region 18 to the periphery of base 16. Low resistivity region 18 provides a low resistance path for the reverse recovery current, so that a large current can flow under source 17 without turning on the parasitic bipolar transistor. In addition to the higher current possible, the reduced gain of the parasitic transistor will reduce any possibility of turning the parasitic transistor on.

By now it should be appreciated that a vertical field effect transistor has been provided wherein a first low resistivity region is formed adjacent to the source and extends into a semiconductor substrate and a second low resistivity region is formed underneath the source. A conventional pre-ohmic pattern is used to form the second low resistivity region, so no additional photolithography steps are required. The second low resistivity region does not extend into or underneath the channel region, resulting in improved control over threshold voltage of the field effect transistor. Because the process is highly tolerant of variations in process conditions which result in a production environment, the field effect transistor is easily mass produced. The first low resistivity region serves to control breakdown voltage and the second low resistivity region serves to reduce gain and series based resistance of a parasitic bipolar transistor, thus greatly reducing any possibility of turn on of the parasitic bipolar transistor. The first and second low resistivity regions are shorted to the source so that the base and emitter of the parasitic bipolar transistor are shorted together, preventing turn on of the parasitic transistor and improving commutating safe operating area and unclamped inductive switching.

I claim:

1. A method of making a vertical field effect transistor having a drain, a gate, and a base wherein a portion of the base under the gate serves as a channel, and a first low resistivity region formed in the base and extending through the base to form a junction with the substrate, the improvement comprising the steps of: implanting a first dopant type inside the base using the gate as a mask thus forming an implanted region; forming a dielectric film over the implanted region; forming a pre-ohmic pattern in the dielectric film; implanting a second dopant type into a portion of the implanted region using the pre-ohmic pattern as a mask; simultaneously redistributing the first and second dopant type in the implanted region so that the first dopant type forms a source and the second dopant type forms a second low resistivity region underneath a portion of the source; and forming a source electrode in contact with the first low resistivity region and the source through the pre-ohmic pattern.

2. The method of claim 1 wherein the second dopant type diffuses faster than the first dopant type.

3. The method of claim 2 wherein the first dopant type is arsenic.

4. The method of claim 1 wherein the second low resistivity region is contained within a boundary of the base.

* * * * *